(12) United States Patent
Akram

(10) Patent No.: US 6,677,658 B2
(45) Date of Patent: Jan. 13, 2004

(54) ADVANCED ISOLATION PROCESS FOR LARGE MEMORY ARRAYS

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/947,231

(22) Filed: Sep. 5, 2001

(65) Prior Publication Data

US 2002/0008298 A1 Jan. 24, 2002

Related U.S. Application Data

(62) Division of application No. 08/912,505, filed on Aug. 18, 1997, now Pat. No. 6,306,727.

(51) Int. Cl.[7] .......................... H01L 29/00; H01L 21/76
(52) U.S. Cl. ...................................... 257/513; 438/439
(58) Field of Search .................................. 438/438, 444, 438/425–439; 257/506, 509, 510, 513, 521

(56) References Cited

U.S. PATENT DOCUMENTS

| | | | |
|---|---|---|---|
| 3,941,629 A | 3/1976 | Jaffe | |
| 4,139,442 A | 2/1979 | Bondur et al. | |
| 4,211,582 A | * 7/1980 | Horng et al. | ................. 148/1.5 |
| 4,333,964 A | 6/1982 | Ghezzo | |
| 4,472,459 A | 9/1984 | Fisher | |
| 4,508,757 A | 4/1985 | Fabricius et al. | |
| 4,615,762 A | 10/1986 | Jastrzebski et al. | |
| 4,630,356 A | 12/1986 | Christie et al. | |
| 4,746,630 A | 5/1988 | Hui et al. | |
| 4,789,560 A | 12/1988 | Yen | |
| 4,959,325 A | 9/1990 | Lee et al. | |
| 4,965,221 A | 10/1990 | Dennison et al. | |
| 5,041,898 A | 8/1991 | Urabe et al. | |
| 5,087,586 A | 2/1992 | Chan et al. | |
| 5,149,669 A | 9/1992 | Hosaka | |
| 5,173,438 A | 12/1992 | Sandhu | |
| 5,210,046 A | 5/1993 | Crotti | |
| 5,308,784 A | * 5/1994 | Kim et al. | ..................... 437/67 |
| 5,316,966 A | 5/1994 | Van Der Plas et al. | |
| 5,409,563 A | 4/1995 | Cathey | |
| 5,438,016 A | 8/1995 | Figura et al. | |
| 5,457,067 A | 10/1995 | Han | |
| 5,458,999 A | 10/1995 | Szabo et al. | |
| 5,607,874 A | 3/1997 | Wang et al. | |
| 5,747,377 A | 5/1998 | Wu | |
| 5,834,359 A | 11/1998 | Jeng et al. | |
| 5,899,727 A | 5/1999 | Hause et al. | |
| 6,008,106 A | 12/1999 | Tu et al. | |

OTHER PUBLICATIONS

"Isolation Technologies For Integrated Circuits," *Silicon Processing For The VLSI Era—vol. II*, Ch. 2, pp. 12–83.
Lutze, et al., "Field Oxide Thinning in Poly Buffer LOCOS Isolation with Active Area Spacings to 0.1 μm," *J. Electrochem. Soc.*, vol. 137, No. 6, Jun. 1990, pp. 1867–1870.
Wolf et al., "Wet Etching Technology," *Silicon Processing For The VLSI Era*, vol. 1, pp. 529–555.

* cited by examiner

Primary Examiner—Caridad Everhart
Assistant Examiner—Calvin Lee
(74) Attorney, Agent, or Firm—Knobbe, Martens, Olson & Bear, LLP

(57) ABSTRACT

A process for creating silicon isolation regions which utilizes silicon islands or pillars as sources of silicon for silicon dioxide (or silicon oxide) fields. These silicon oxide fields separate active areas within a device. By providing multiple sources of silicon for silicon oxide formation, the described invention minimizes the use of trench wall edges as silicon sources for silicon oxide growth. This reduction in stress helps to minimize encroachment and undergrowth or bird's beak formation. This process also leads to a reduced step height between the field oxide and active areas, thus providing a more planar wafer surface.

6 Claims, 7 Drawing Sheets

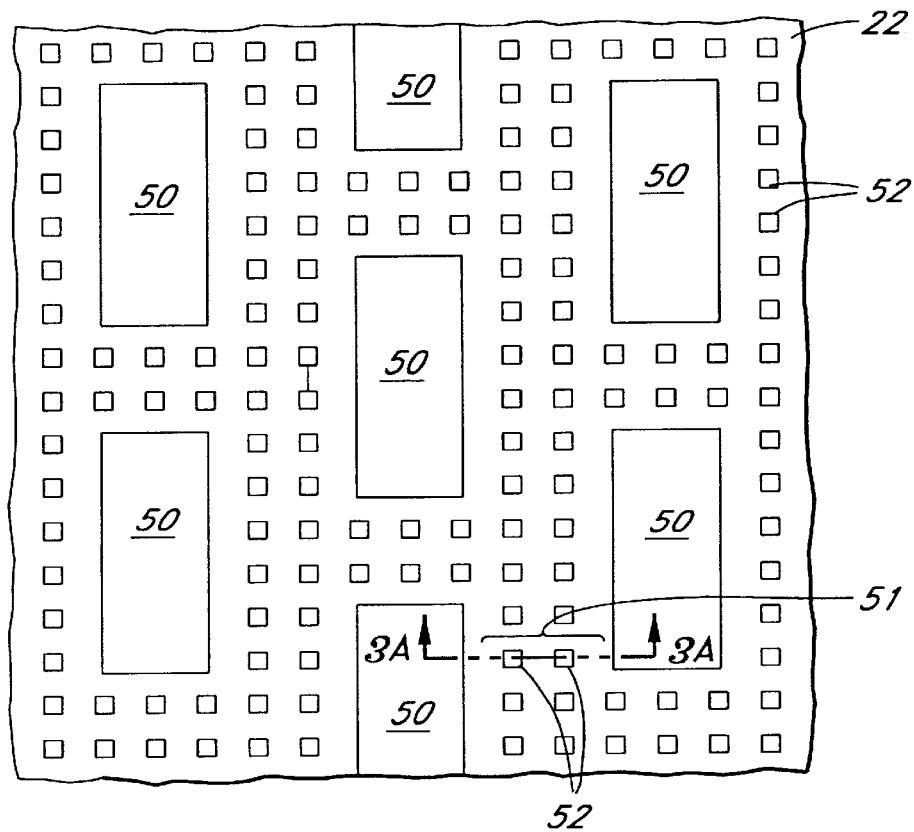
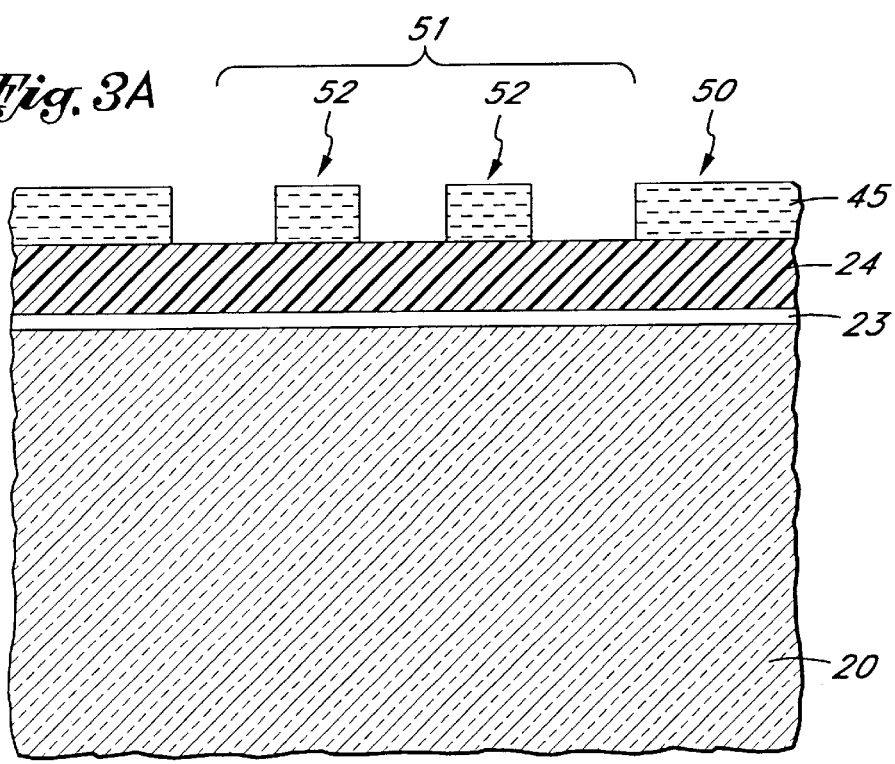

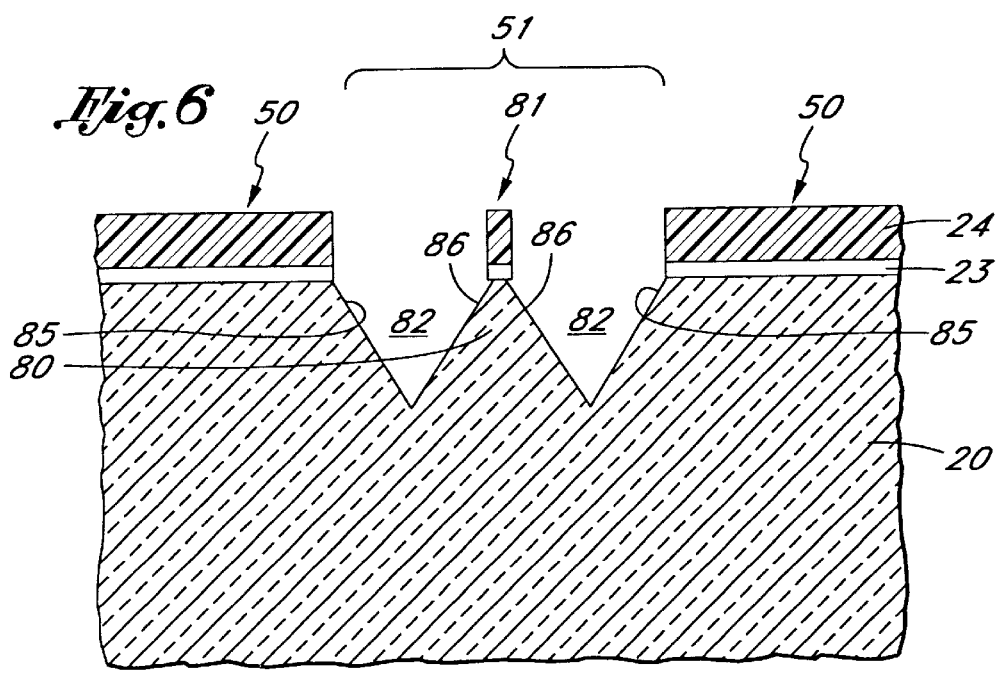
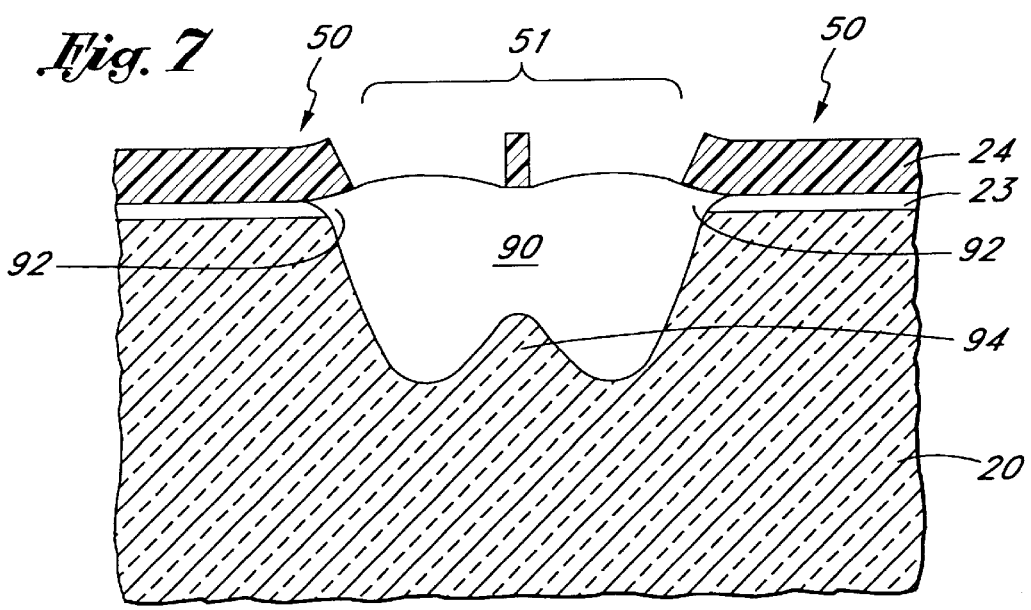

ADVANCED ISOLATION PROCESS FOR LARGE MEMORY ARRAYS

This application is a Divisional of prior application Ser. No. 08/912,505, filed Aug. 18, 1997, now U.S. Pat. No. 6,306,737.

FIELD OF THE INVENTION

The invention relates generally to silicon integrated circuit process technology. In particular, the invention pertains to field isolation process technology such as found in LOCal Oxidation of Silicon (LOCOS).

BACKGROUND OF THE INVENTION

Implementing electronic circuits involves connecting isolated devices through specific electronic paths. In silicon integrated circuit fabrication it is necessary to isolate devices, which are built into the same silicon matrix, from one another. They are subsequently interconnected to create the desired circuit configuration. In the trend toward integrated circuits of continually higher density, parasitic interdevice currents become more problematic. Thus, isolation technology has become one of the most critical aspects of contemporary integrated circuit fabrication.

Over the last few decades a variety of successful isolation technologies have been developed to address the requirements of different integrated circuit types, such as NMOS, CMOS and bipolar. In general, the various isolation technologies exhibit different attributes with respect to such characteristics as minimum isolation spacing, surface planarity, process complexity and defect density generated during the isolation processing. Moreover, it is common to trade off some of these characteristics when developing an isolation process for a particular integrated circuit application.

In metal-oxide-semiconductor (MOS) technology it is necessary to provide an isolation structure that prevents parasitic channel formation and leakage currents between adjacent devices, such devices being primarily NMOS or PMOS transistors or CMOS circuits. The most widely used isolation technology for MOS circuits has been that of LOCOS isolation, an acronym for LOCal Oxidation of Silicon. LOCOS isolation essentially involves the growth of recessed or semirecessed silicon dioxide ($SiO_2$ or oxide) in unmasked nonactive or field regions of the silicon substrate producing the so-called field oxide (FOX). The masked regions of the substrate generally define active areas (AA) within which devices are subsequently fabricated. The FOX is generally grown thick enough to minimize parasitic capacitance and prevent parasitic devices from forming in these regions, but not so thick as to cause step coverage problems. The great success of LOCOS isolation technology is to a large extent attributed to its cost effectiveness and the inherent simplicity of incorporating the process into conventional MOS process integration.

An exemplary prior art LOCOS isolation process is illustrated in FIGS. 1–2. As shown in FIG. 1, a silicon substrate 20 is typically masked by a so-called masking stack 22 comprising a pad-oxide layer 23 and a masking nitride layer 24 ($Si_3N_4$). The masking stack 22 is typically patterned by conventional photolithographic means and etched to expose selected regions of the silicon substrate 20 for FOX growth. As shown in FIG. 2, an exemplary active area array 30 is defined and protected from oxide growth by the patterned masking stack segments 32. Field isolation of the active areas is achieved by growing FOX in the unmasked portions (e.g., 31 and 34) of the silicon substrate. Typical parameters for the oxidation step include heating at about 1,000° C. for about 2–4 hours in the presence of oxygen, as disclosed in Wolf, "Silicon Processing for the VLSI Era; Volume 2—Process Integration," Lattice Press, for example. After FOX growth, the masking stack segments 32 are removed and devices are fabricated within the active areas.

In one variation, termed recessed LOCOS, a trench may be etched within the silicon substrate, and the walls of the trench are oxidized to provide the electrically isolating field oxide around the perimeter surfaces of the trench. Such processes are disclosed, for example, in Wolf, Vol. 2, cited above.

In spite of its success, several limitations of LOCOS technology have driven the development of improved or alternative isolation structures. As further shown in FIG. 2, active area features 36, defined by the resulting FOX growth, often differ from the intended structure 38 because of nonideal effects present in conventional LOCOS processing. For example, light diffraction and interference around photolithographic mask edges during the patterning process typically produces rounding at mask corners, an effect which is exacerbated in small features such as found in DRAM active area arrays 30. Additionally, isolated, narrow photolithographic features such as shown here are often susceptible to lifting and nonuniformities due to mask misalignment.

A major limitation in LOCOS isolation is that of oxide undergrowth or encroachment at the edge of the masking stack segment 32. A cross-section 2A—2A of the FOX structure after LOCOS isolation, shown in FIG. 2A, illustrates the deleterious effects of the encroachment, often referred to as a "bird's beak" 40 due to its sharp, tapering edge profile. This bird's beak 40 poses a serious limitation to device density, since that portion of the oxide adversely influences device performance while not significantly contributing to device isolation. Furthermore, as IC device density increases, the undesirable effects of bird's beak growth become particularly problematic for active area features in the sub half-micron regime. As shown in FIG. 2A, the bird's beak 40 of FOX regions 31 may extend beneath a substantial portion of mask regions 33 or 35 near the end or terminating portion of an active area. The bird's beak 40 becomes particularly severe at narrow, terminating features, often causing masking stack lifting and increasing stress-induced defects in the wafer. The bird's beak 40 also reduces the active area 36 on which devices can be fabricated directly in the bulk silicon 20, such that a large area of the chip is typically lost after field oxidation is complete.

Unfortunately, various techniques augmenting the basic LOCOS process are often accompanied by undesirable side effects or undue process complexity. For example, in DRAM fabrication technology, conventional LOCOS processes are often scaled for smaller device dimensions. This may be accomplished by increasing the thickness of the nitride 24 and reducing the thickness of the pad oxide 23 to reduce the FOX encroachment. However, this may increase stress in the nitride 24 as well as the underlying silicon 20, creating crystal defects which increase device junction leakage. On the other hand, if the nitride 24 thickness is not increased, stack lifting causes unpredictable changes in the shape of the active areas, particularly at the edges of the small features (i.e., active areas) typically found in DRAM applications.

In the continuing trend toward higher density and higher performance integrated circuits, effective field isolation on a sub-micron scale remains one of the most difficult challenges facing current process technology. While conventional LOCOS processes have sufficed in the past, there remains a critical need for improved field isolation.

SUMMARY OF THE INVENTION

An object of the present invention is to provide a field isolation process which reduces distortion of active areas and encroachment of field isolation into such active areas. A further object of the present invention is to provide an isolation process for optimizing a field isolation configuration for the isolation requirements of gigabyte memory arrays.

The disclosed field isolation process comprises the formation of at least one protrusion of silicon in a cavity. In one embodiment of the invention, the entire perimeter of the protrusion is surrounded by a trench. The protrusion is exposed to oxygen resulting, in the formation of silicon oxide. As the silicon is converted to silicon oxide, the silicon oxide expands to fill the trench cavity.

By properly sizing and spacing the silicon sources (silicon protrusions) throughout the region to be displaced by silicon dioxide or silicon oxide, oxide growth from the edges of active areas is reduced. The silicon required for the formation of $SiO_2$ is mostly provided by the silicon protrusion(s) instead of the silicon under the nitride mask. This process reduces stress on the wafer and minimizes oxide encroachment into the active areas, thus reducing undergrowth and the formation of a bird's beak.

BRIEF DESCRIPTION OF THE DRAWINGS

FIG. 3 is a partial plan view of photoresist patterned for defining an active area array and field isolation regions, and for defining islands within the isolation regions, in accordance with a first preferred embodiment of the present invention.

FIG. 3A shows an expanded cross sectional view of one field isolation region of FIG. 3.

FIG. 6 is a sectional view of a field isolation region, like FIG. 4, utilizing a different shaped pillar, in accordance with a second preferred embodiment of the present invention.

FIG. 7 illustrates the mask and field isolation structure of FIG. 6 following substantial conversion of the pillars to silicon oxide.

DETAILED DESCRIPTION OF THE PREFERRED EMBODIMENT

As described above, a difficult problem in conventional field isolation, particularly in LOCOS processes, is the large encroachment of field oxide (FOX) into the active area. In accordance with preferred embodiments of the present invention, this problem is mitigated by utilizing silicon source protrusions within an isolation region. It will be understood that the protrusions may be formed by deposition of silicon into a prefabricated trench or cavity within the semiconductor substrate. For embodiments described herein, however, the silicon source protrusions of the preferred embodiments comprise pillar structures carved from a silicon substrate and located between active areas. Regardless of how the protrusion is formed, however, the surfaces of the protrusions provide silicon for the growth of silicon oxide.

Figure 1:
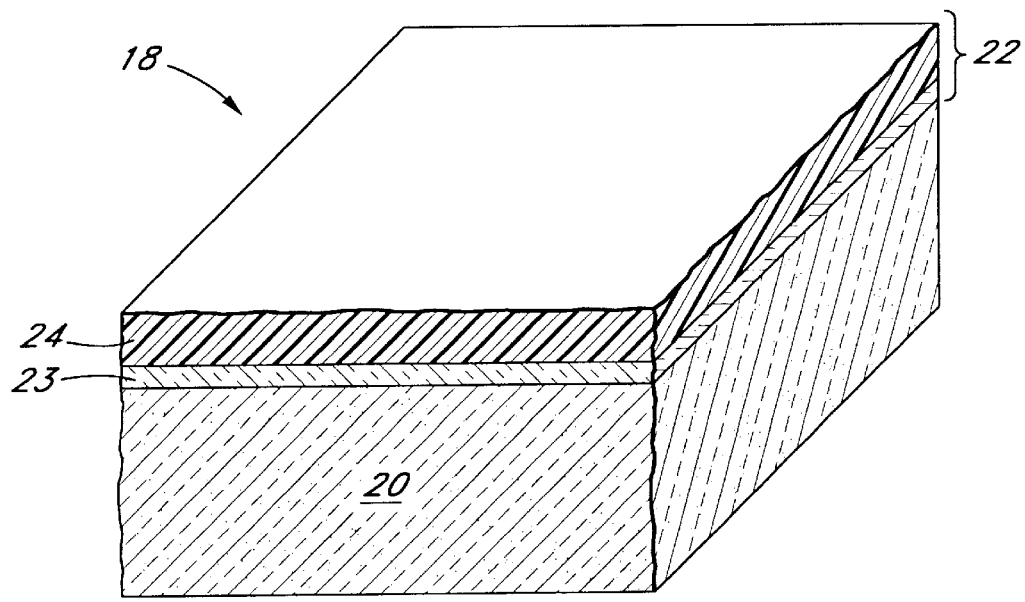
FIG. 1 is a partial perspective of a conventional masking stack over a silicon substrate.
Figure 2:
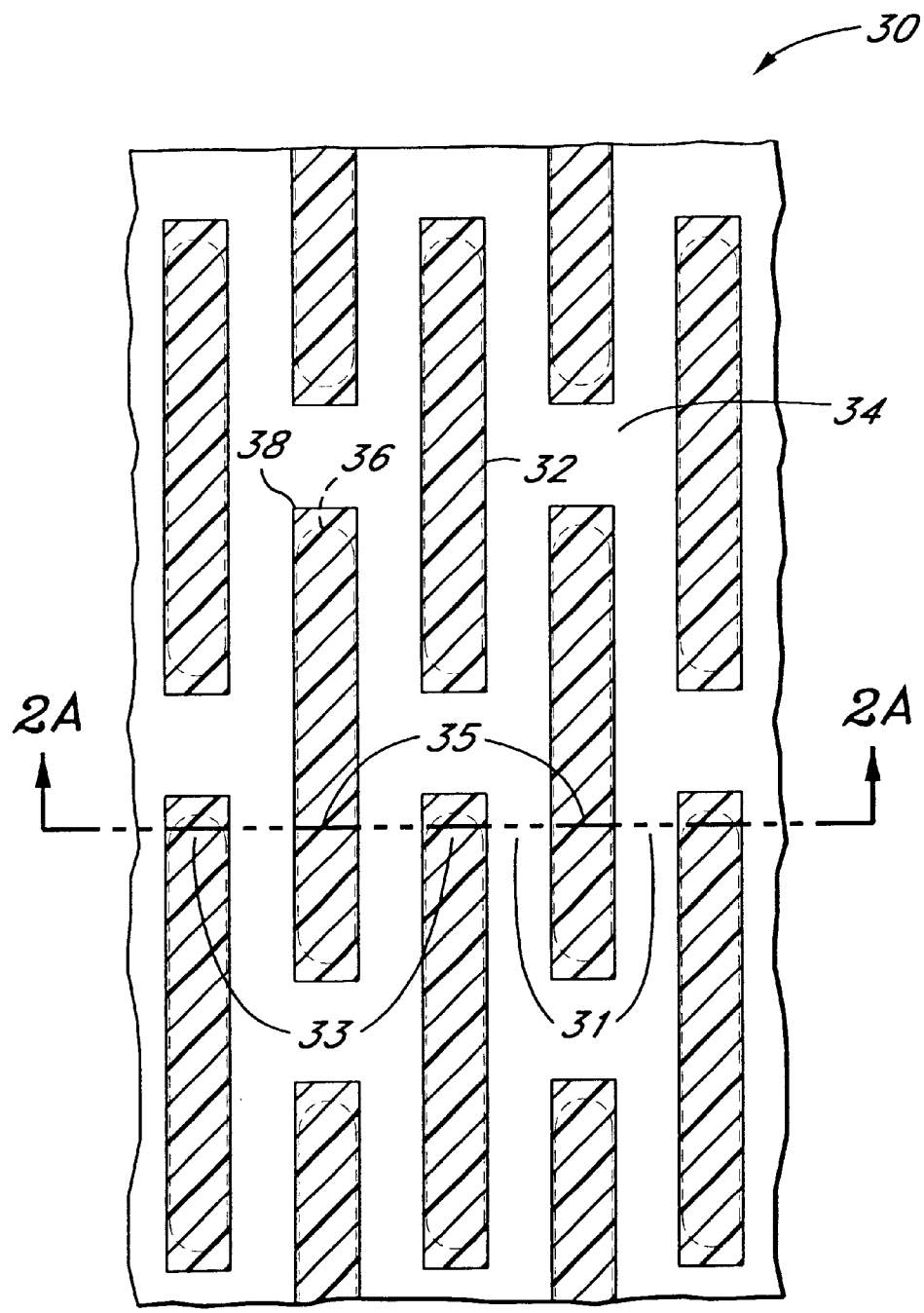
FIG. 2 is a partial plan view of an exemplary patterned prior art mask for a field isolation array.
Figure 2A:
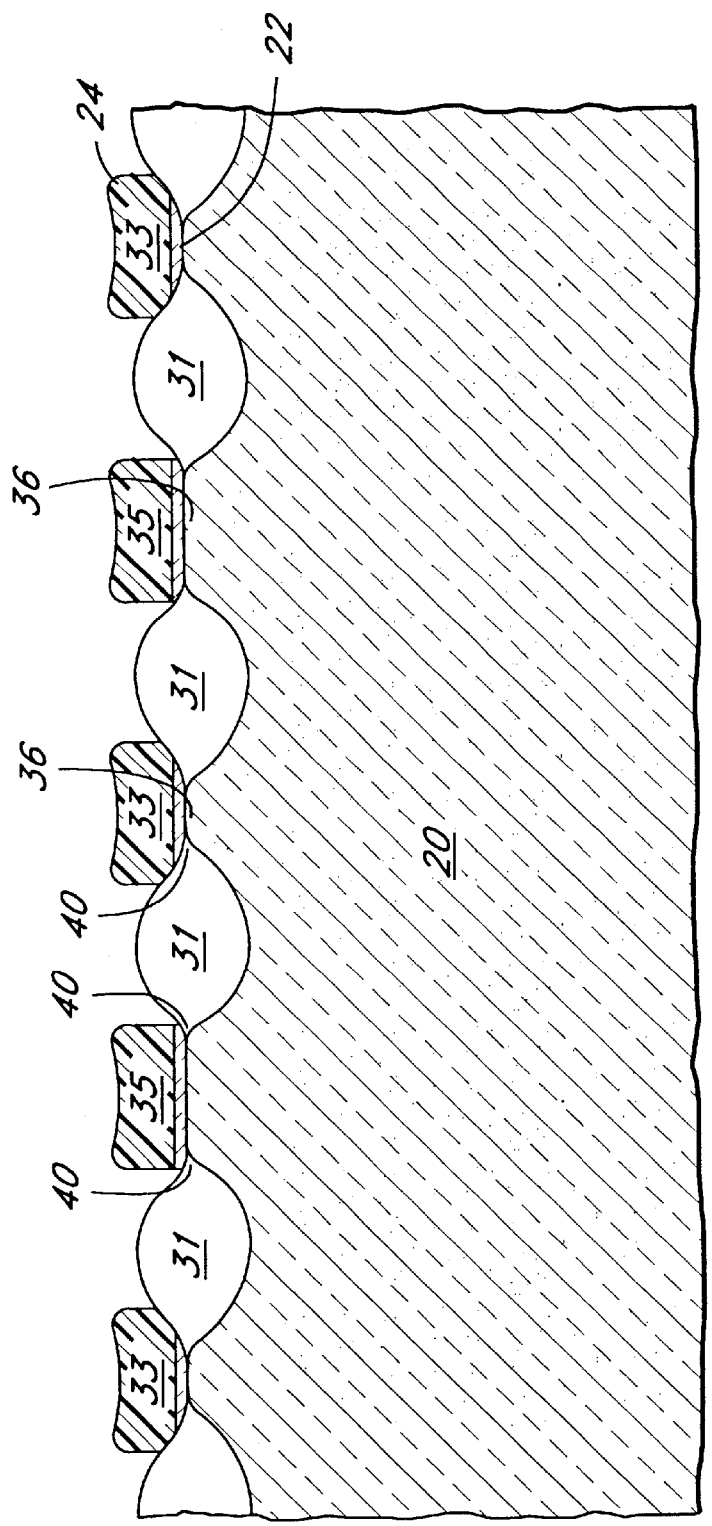
FIG. 2A is a sectional view, taken along lines 2A—2A of FIG. 2, illustrating the mask and field isolation regions.

For the preferred embodiments, a conventional masking stack 22 may be formed over a silicon substrate 20, comprising a thin pad oxide 23 (silicon dioxide) and a nitride layer 24 (silicon nitride), as shown in prior art FIG. 1. The pad oxide 23 functions to prevent transition of stresses between the silicon substrate 20 and the subsequently deposited layers. It also prevents residual nitrogen from the nitride layer 24 from reacting with underlying active areas. Typically, the pad oxide 23 is formed by oxidizing the silicon substrate 20 at about 700° C. to 1,100° C., until the pad oxide 23 reaches a thickness of approximately 50 Å to 500 Å, most preferably about 300 Å. Next the layer of masking nitride 24 is deposited, preferably using a low pressure chemical vapor deposition (LPCVD) method known in the art, with a thickness of approximately 200 to 3,000 Å, most preferably about 2,000 Å. Thick nitride layers can substantially reduce field oxide encroachment into the active areas during the growth of the field oxide isolation regions. The resulting structure forms the masking stack 22.

Referring now to FIG. 3, the masking stack 22 is next patterned, whereby a set of masked features is formed. The patterning step may be performed in a variety of ways well known in the art. Conventional photolithography techniques, or other suitable techniques known in the art, are then employed to form the desired pattern. Typically, a layer of photoresist material 45 is formed over the oxidation masking stack. For example, appropriate sections of the resist layer 45 may be exposed through a mask and developed to leave the patterned resist 45 shown in FIG. 3. The resist 45 should be patterned to define a plurality of active area regions 50 over the wafer surface (regions below which devices will be formed in the substrate) surrounded by field isolation regions 51. At least one island region 52 (below which silicon pillars will be formed) is defined in each field isolation region 51. For extremely dense circuitry of future generation DRAMs or other integrated circuits, special techniques may be necessary to define very small island regions. Among other methods, microlithography (e.g., using x-ray lithography), phase-shifting techniques, or micro-masking techniques may be used to define the islands for dense circuits.

FIG. 3 illustrates one example of a surface shape and pattern for the island regions 52, in accordance with a first preferred embodiment of the present invention, whereby a plurality of square islands 52 are dispersed among the active area regions 50. FIG. 3B is a sectional view, showing the patterned resist over the masking stack 22 of one field isolation region, defining both active area regions 50 and island regions 52.

Figure 4:
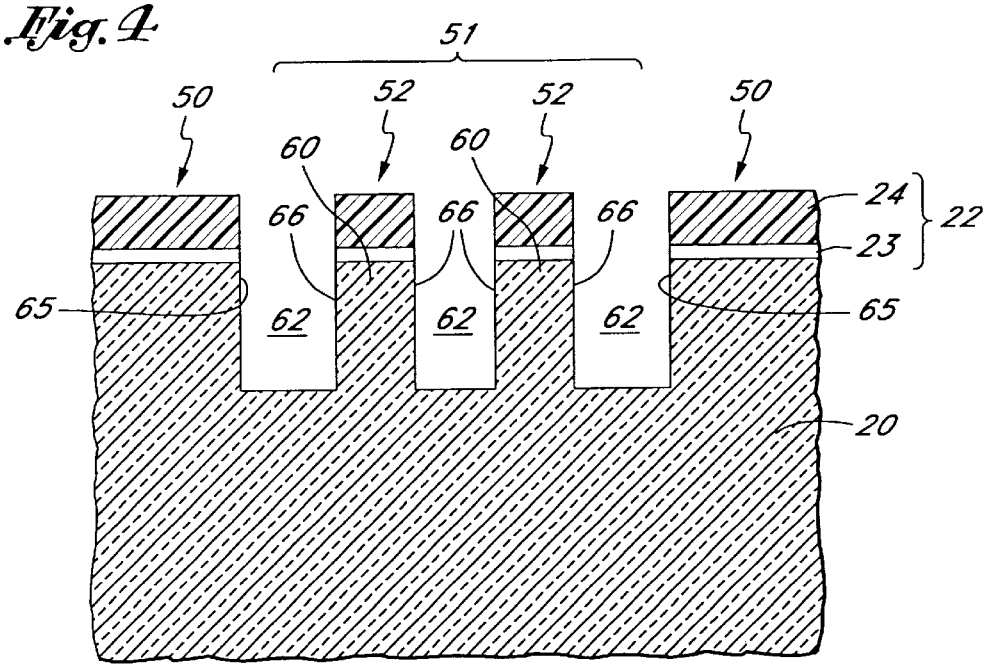
FIG. 4 illustrates the field isolation region of FIG. 3A following etch steps through a masking stack and the underlying silicon substrate, thereby forming pillars within a trench.

Referring now to FIG. 4, exposed portions of the underlying masking stack 22 (i.e., those portions not covered by the resist in active area regions 50 and island regions 52), comprising the nitride 24 and pad oxide 23, are then removed. Preferably, the masking stack 22 is removed by anisotropic etching, resulting in dimensions faithful to the resist mask. The resist mask 45 may be stripped after the exposed nitride 24 has been removed, or after the pad oxide 23 is etched through, or at an even later stage, as is known in the art of photolithography.

Exposed portions of the silicon substrate 20 are then etched in accordance with the preferred embodiments to form at least one silicon pillar 60 within a trench 62 between active areas 50. For the first preferred embodiment, a known anisotropic dry etch is most preferably employed. As illustrated, anisotropic etching results in the substantially vertical trench sidewalls 65 and pillar sidewalls 66, roughly perpendicular to the upper surface of the substrate 20.

The nitride 24 (or resist, if not removed) on the island regions 52 shield portions of the underlying silicon substrate 20 within the field isolation region 51 from the silicon etch. Thus, the silicon pillar structures 60 remain between active area regions 50 following the silicon etch. The pillars 60 can be uniformly spread to form an array of pillars, as best seen from the top plan view in FIG. 3. The pillar structures 60 are characterized by a height, determined by the depth of the trench 62, of between about 500 Å and 8,000 Å, more preferably about 2,000 Å to 4,000 Å, and most preferably about 3,000 Å. The width of the pillars 62, determined by the width of the island regions 52, is approximately 1,000 Å to 3,500 Å wide, most preferably about 2,000 Å. The pillars 60 are spaced from one another (in cases where there is more than one pillar) and from the edge of the active area regions 50 by a trench 62 which surrounds the pillars 60. The vertical pillar sidewalls 66 of the illustrated first preferred embodiment are separated from adjacent pillars 60 and from the trench sidewall 65 by approximately 500 Å to 3,000 Å. The actual height and width of the pillars 60, as well as the trench space separating the pillars 60, is determined by the etching process used. Although two pillars 60 are shown in FIG. 4B between the active area regions 50, the number of the pillars may be 1, 2, 3 or more depending on the distance between the active areas 50 or the pillar dimensions chosen.

It will be understood by one of skill in this art, in light of the entire disclosure herein, that the dimensions of the trench and pillars (or other protrusions) are important only insofar as they relate to one another. The dimensions may vary from the ranges set forth above as long as they are all chosen such that the pillars have an appropriate ratio of surface area to the size of the trench to be filled. It will be understood by those of skill in the art of field isolation that improper spacing could result in incomplete oxidation of the pillars in a later step, or over-oxidation leading to conventional bird's beak formation and other stresses.

Figure 5:
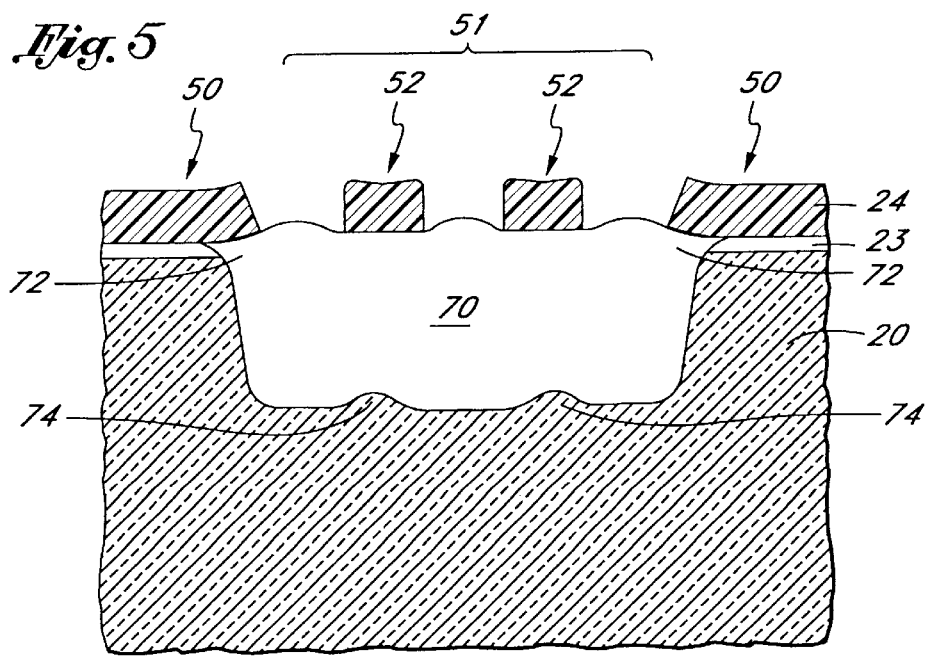
FIG. 5 illustrates the mask and field isolation structure of FIG. 4 following substantial conversion of the pillars to silicon oxide.

Referring now to FIG. 5, an oxidation step follows formation of the pillars 60. At least the pillar walls 66 are exposed to an oxygen-containing ambient, and for the preferred embodiment, the trench walls 65 are also exposed and therefore oxidized. For alternative embodiments (not illustrated), the trench sidewalls 65 may be protected from the oxidation, as disclosed, for example, in U.S. Pat. No. 5,087,586, issued to Chan et al. and assigned to the assignee of the present invention. The oxygen-containing ambient and temperature for this step may be similar to those of prior art oxidation steps for LOCOS processes. However, the oxide growth pattern and time for oxidation differs significantly. For example, for the first preferred embodiment, with dimensions as set forth above, a wet or steam oxidation (with $O_2$ and $H_2O$ ambient) may be performed at about 750° C. to 1,100° C., most preferably about 800° C., for a period on the order an hour, preferably between about half an hour and two hours.

A field oxide or FOX 70, comprising $SiO_2$, results from this oxidation step. The pillar shape, dimensions and the trench width are all chosen such that the pillar structure 60 will be substantially converted to the field oxide 70, as shown in FIG. 5. Oxide also grows from the trench walls 65 (FIG. 4) and trench floor in the preferred embodiment. The trench 62, as defined by the field isolation region 51, is thus filled with oxide 70 grown from both the pillars 60 and silicon surfaces of the trench 62. The thickness of the field oxide, for the most preferred dimensions and oxidation parameters noted above, should be between about 500 Å and 2,800 Å, providing adequate field isolation for the integrated circuit. Alternative dimensions may yield oxide thicknesses between about 1,000 Å and 10,000 Å.

The pillars 60 expose a large surface area of silicon to the oxidizing ambient, such that oxidation time is reduced and these pillars provide most of the silicon for $SiO_2$ formation. Accordingly, lateral diffusion of oxygen into the active areas 50 is minimized and comparatively little silicon from the trench walls at the edge of the active areas 50 is consumed. As a result, the field oxide 70 demonstrates a relatively vertical profile with minimal encroachment into the adjacent active areas 50. The process thus produces a smaller bird's beak 72 structure and a reduced step between the active area 50 surface and the field oxide 70 surface, as compared to that produced by conventional LOCOS processes. Stresses on the nitride mask 24 and other edge stresses that can cause lifting are reduced accordingly, while adequate isolation is provided by the field oxide 70. Small residual silicon humps 74 underlying the nitride mask 45 of the island region 52 may or may not remain, but should at any rate not unduly affect the electrical isolation provided by the field oxide 70.

FIG. 6 shows an alternate pillar structure 80 (defined by an alternate island region 81 of the nitride 24) within an alternate trench 82, in accordance with a second preferred embodiment of the present invention. The pillar 80 is formed with sloping trench sidewalls 85 and/or sloping pillar sidewalls 86 when etching through the silicon substrate 20. The trench may have similar dimensions (on average) as that of the first embodiment. Such sloped sidewalls 84 and/or 86 may be achieved by known techniques such as anisotropic etches, including but not limited to anisotropic wet etch. For example, a wet etch may be chosen which etches 100 silicon more quickly than 111 silicon, resulting in sidewall sloped at about 54° to the horizontal. Etches to slope silicon are known in the art and include, for example, $KOH/H_2O$ mixtures. These etch silicon at 50° C. at the rate of about 6 $\mu$m/hr. where the KOH is 45% by volume.

Thus, the preferred pillar walls need not be perpendicular to the silicon surface. Nor do the protrusions of alternate embodiments need to be a particular shape, size or number between active areas. For the second preferred embodiment, one to two such pillars 80 may be used for a typical field isolation region 51 with a width of about 9,000 $\mu$, whereby the pillars may be characterized by an average width of between about 1,500 Å and 3,500 Å.

FIG. 7 illustrates a field oxide 90 grown from the sloped walls 86 of the pillar 80 and the surrounding trench walls 85 at the edge of the active area 50. The field oxide 90 is preferably formed by a wet oxidation process at approximately 750° C.–1,110° C., most preferably about 900° C. for a period on the order of 1 hour. The field oxide 90 of the second embodiment has a preferred thickness of approximately 1,000 Å–10,000 Å, most preferably about 2,500 Å for the most preferred dimensions and oxidation parameters noted above. As with the first preferred embodiment, a bird's beak 92 formed by the process of the second embodiment is small compared to that of conventional recessed LOCOS processes without silicon pillars. A silicon hump 94 underlying the nitride 24 of the island region 81 may be slightly larger than the corresponding humps 74 (see FIG. 5) of the first embodiment.

Figure 8:
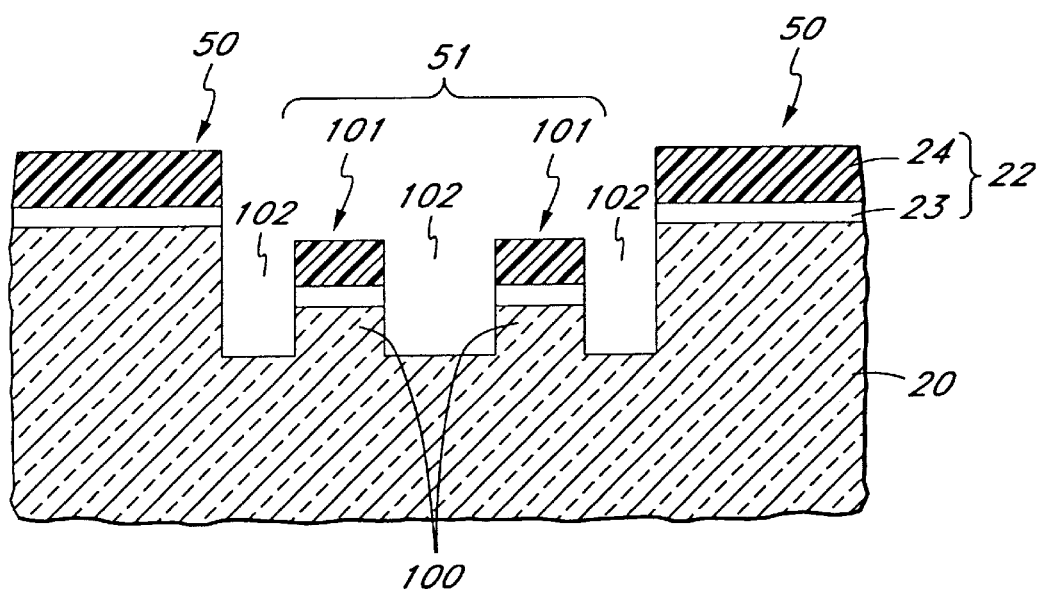
FIG. 8 is a sectional view of a field isolation region, like FIG. 4, utilizing yet another pillar configuration, in accordance with a third preferred embodiment of the present invention.

Referring now to FIG. 8, smaller recessed pillars 100 are shown, defined by a recessed island region 101 of the nitride 24, within a vertical-walled trench structure 102, in accordance with a third preferred embodiment. Such recessed pillars 100 may be formed by slightly recessing the silicon of the field isolation region 51 prior to defining the island regions 101 by use of photolithographic techniques. It will be understood that, by increasing masking and etching complexity in other ways, one skilled in the art may find many alternative pillar structures to accomplish the objectives of the preferred embodiments disclosed herein.

This structure, like the previous two embodiments, may also reduce bird's beak formation. More importantly, however, this third embodiment results in a planar field oxide and a further reduced step height between the field oxide and the active area. The entire wafer surface is thus relatively planar after the oxidation, facilitating later process steps.

Following oxidation in accordance with the preferred embodiments, removal of the nitride mask may then be achieved by any of a variety of processes familiar to those of ordinary skill in the art. Similarly, the wafer may be further processed using known circuit integration fabrication techniques.

The process of the preferred embodiments results in reduced consumption of the active area, a small bird's beak formation, and a more planar wafer surface relative to conventional LOCOS processes. At the same time, good isolation may be provided with just one mask (or more than one mask for more complex variations), making the process simple to incorporate into current and future integration process flows.

Although the foregoing invention has been described in terms of certain preferred embodiments, other embodiments will become apparent to those of ordinary skill in the art, in view of the disclosure herein. For example, the silicon source protrusions of the preferred embodiments comprise silicon pillars carved or etched from the silicon substrate. However, it will be understood that protrusions of alternative embodiments may comprise silicon structures deposited onto a trench floor and spaced from the active area boundaries. Accordingly, the present invention is not intended to be limited by the recitation of preferred embodiments, but is instead intended to be defined solely by reference to the appended claims.

What is claimed is:

1. A field isolation structure, the structure comprising:
   a field oxide region having substantially vertical sidewalls; and
   at least one silicon hump protruding as an island upward from the silicon substrate under a field oxide and into the field oxide within the field oxide region, wherein the hump is substantially electrically inactive and the volume of the hump is smaller than the volume of the field oxide.

2. The field isolation structure of claims 1, wherein the at least one silicon hump is a single hump.

3. The field isolation structure of claim 2, wherein the hump is centrally located within the field oxide region with respect to the sidewalls.

4. A field isolation structure, the structure comprising:
   a field oxide region having substantially sloped sidewalls;
   a silicon substrate underlying a field oxide within the field oxide region; and
   at least one rounded, silicon hump protruding upwards as an island from the silicon substrate into the field oxide, wherein the hump is substantially electrically inactive and the field oxide occupies a majority of a volume defined by the field oxide region.

5. The field isolation structure of claim 4, wherein the silicon hump is an island with respect to the region sidewalls.

6. The field isolation structure of claim 4, wherein the silicon hump is located equally spaced between the sidewalls.

* * * * *